United States Patent
Chen et al.

(10) Patent No.: US 7,783,911 B2
(45) Date of Patent: Aug. 24, 2010

(54) PROGRAMMABLE BUS DRIVER LAUNCH DELAY/CYCLE DELAY TO REDUCE ELASTIC INTERFACE ELASTICITY REQUIREMENTS

(75) Inventors: Jonathan Y. Chen, Marlboro, NY (US); Patrick J. Meaney, Poughkeepsie, NY (US); Gary A. Van Huben, Poughkeepsie, NY (US); David A. Webber, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 507 days.

(21) Appl. No.: 11/426,666

(22) Filed: Jun. 27, 2006

(65) Prior Publication Data

US 2007/0300099 A1    Dec. 27, 2007

(51) Int. Cl.
 G06F 11/00 (2006.01)
 G06F 13/42 (2006.01)
 H04L 7/00 (2006.01)
(52) U.S. Cl. ................ 713/401; 713/503; 375/354
(58) Field of Classification Search ........... 713/400, 713/401, 500, 503; 375/354; 370/503
 See application file for complete search history.

(56) References Cited

U.S. PATENT DOCUMENTS

| | | | | |
|---|---|---|---|---|
| 5,805,872 | A | * | 9/1998 | Bannon .................. 713/500 |
| 5,867,541 | A | * | 2/1999 | Tanaka et al. ............ 375/354 |
| 5,971,889 | A | | 10/1999 | Ohashi et al. |
| 6,114,886 | A | | 9/2000 | Seo |
| 6,166,563 | A | | 12/2000 | Volk et al. |
| 6,170,506 | B1 | | 1/2001 | Butwin et al. |
| 6,202,128 | B1 | | 3/2001 | Chan et al. |
| 6,263,463 | B1 | | 7/2001 | Hashimoto |
| 6,279,073 | B1 | * | 8/2001 | McCracken et al. ......... 711/105 |
| 6,282,128 | B1 | | 8/2001 | Lee |
| 6,315,692 | B1 | | 11/2001 | Takahashi et al. |
| 6,335,955 | B1 | | 1/2002 | Knotts |
| 6,373,289 | B1 | | 4/2002 | Martin et al. |
| 6,396,322 | B1 | | 5/2002 | Kim et al. |
| 6,424,198 | B1 | | 7/2002 | Wolford |
| 6,442,102 | B1 | | 8/2002 | Borkenhagen et al. |

(Continued)

OTHER PUBLICATIONS

Non-Final Office Action, Nov. 20, 2008, in U.S. Appl. No. 11/426,675.

(Continued)

*Primary Examiner*—Mark Connolly
(74) *Attorney, Agent, or Firm*—Jon A. Gibbons; Fleit, Gibbons, Gutman, Bongini & Bianco P.L.

(57) ABSTRACT

A double data rate elastic interface in which programmable latch stages provide an elastic delay, preferably on the driving side of the elastic interface. However, the invention is not limited to the driver side/chip, it can be implemented in the receiver side/chip as well. However, since the receiver side of an elastic interface already has complicated logic, the invention will be usually implemented on the driving side. The programmable latch stages on the driving chip side of the interface, can often operate at the local clock frequency (the same frequency as the elastic interface bus clock frequency), which in turn is half of the double data rate at which the receiving latch stages operate, thereby decreasing the logic and storage resources in the interface receivers. The programmable latch stages can also be used in the case that the local clock frequency is twice the elastic interface bus clock frequency.

9 Claims, 4 Drawing Sheets

U.S. PATENT DOCUMENTS

| | | | |
|---|---|---|---|
| 6,452,865 B1 | 9/2002 | Wolford | |
| 6,473,838 B1 | 10/2002 | Bass et al. | |
| 6,477,592 B1* | 11/2002 | Chen et al. | 710/52 |
| 6,493,285 B1 | 12/2002 | Wolford | |
| 6,510,503 B2 | 1/2003 | Gillingham et al. | |
| 6,560,669 B1 | 5/2003 | Ryan | |
| 6,584,578 B1 | 6/2003 | Faue | |
| 6,603,706 B1 | 8/2003 | Nystuen | |
| 6,671,753 B2* | 12/2003 | Dreps et al. | 710/60 |
| 6,715,096 B2 | 3/2004 | Kuge | |
| 6,760,856 B1* | 7/2004 | Borkenhagen et al. | 713/401 |
| 6,826,113 B2 | 11/2004 | Ellis et al. | |
| 6,832,294 B2 | 12/2004 | Wicki et al. | |
| 6,838,712 B2 | 1/2005 | Stubbs | |
| 6,874,097 B1* | 3/2005 | Aliahmad et al. | 713/401 |
| 6,907,493 B2 | 6/2005 | Ryan | |
| 6,912,628 B2 | 6/2005 | Wicki et al. | |
| 6,914,829 B2 | 7/2005 | Lee | |
| 6,920,576 B2* | 7/2005 | Ehmann | 713/400 |
| 7,017,067 B2* | 3/2006 | Zielbauer | 713/401 |
| 7,089,440 B2* | 8/2006 | Wu | 713/401 |
| 7,135,845 B2 | 11/2006 | Zverev et al. | |
| 7,135,854 B2 | 11/2006 | Brian et al. | |
| 7,138,844 B2* | 11/2006 | Lee et al. | 327/276 |
| 7,225,354 B2* | 5/2007 | Tseng | 713/503 |
| 7,295,489 B2 | 11/2007 | Yoon et al. | |
| 7,376,021 B2 | 5/2008 | Heo et al. | |
| 7,412,618 B2 | 8/2008 | Ferraiolo et al. | |
| 7,440,531 B2* | 10/2008 | Dreps et al. | 375/371 |
| 2001/0046163 A1 | 11/2001 | Yanagawa | |
| 2002/0018395 A1 | 2/2002 | McLaury | |
| 2002/0130795 A1 | 9/2002 | Moon | |
| 2003/0001651 A1 | 1/2003 | La Rosa | |
| 2003/0043926 A1* | 3/2003 | Terashima et al. | 375/257 |
| 2003/0065908 A1 | 4/2003 | Patel et al. | |
| 2003/0085734 A1 | 5/2003 | Nguyen | |
| 2003/0217214 A1 | 11/2003 | Calvignac et al. | |
| 2003/0217302 A1* | 11/2003 | Chen et al. | 713/401 |
| 2004/0071171 A1 | 4/2004 | Ghiasi | |
| 2004/0089069 A1 | 5/2004 | Weber et al. | |
| 2004/0098551 A1 | 5/2004 | Heo et al. | |
| 2004/0117742 A1 | 6/2004 | Emberling et al. | |
| 2004/0123173 A1 | 6/2004 | Emberling et al. | |
| 2004/0148538 A1 | 7/2004 | Li et al. | |
| 2004/0174765 A1 | 9/2004 | Seo et al. | |
| 2004/0239388 A1 | 12/2004 | Lee | |
| 2004/0260962 A1 | 12/2004 | Suen et al. | |
| 2005/0001655 A1 | 1/2005 | Takeda | |
| 2005/0050289 A1 | 3/2005 | Raad | |
| 2005/0105349 A1 | 5/2005 | Dahlberg et al. | |
| 2005/0114724 A1* | 5/2005 | Wu | 713/401 |
| 2005/0141331 A1 | 6/2005 | Cho | |
| 2005/0157827 A1 | 7/2005 | Yoon et al. | |
| 2005/0162187 A1 | 7/2005 | Nguyen | |
| 2005/0174145 A1 | 8/2005 | Dosho et al. | |
| 2005/0195928 A1* | 9/2005 | Yamazaki | 375/354 |
| 2007/0300095 A1 | 12/2007 | Fee et al. | |
| 2007/0300098 A1 | 12/2007 | Chen et al. | |
| 2007/0300099 A1 | 12/2007 | Chen et al. | |

OTHER PUBLICATIONS

Non-Final Office Action, Nov. 25, 2008, in U.S. Appl. No. 11/426,648.
Non-Final Office Action, Dec. 11, 2008, in U.S. Appl. No. 11/426,651.
Non-Final Office Action, Dec. 16, 2008, in U.S. Appl. No. 11/426,666.
Non-Final Office Action, Dec. 18, 2008, in U.S. Appl. No. 11/426,671.
Final Office Action, Apr. 23, 2009, in U.S. Appl. No. 11/426,675.
Final Office Action, Jun. 3, 2009, in U.S. Appl. No. 11/426,651.
Final Office Action, Jun. 15, 2009, in U.S. Appl. No. 11/426,648.
Non-Final Office Action, Aug. 13, 2009, in U.S. Appl. No. 11/426,675.

* cited by examiner

PROGRAMMABLE BUS DRIVER LAUNCH DELAY/CYCLE DELAY TO REDUCE ELASTIC INTERFACE ELASTICITY REQUIREMENTS

CROSS-REFERENCE TO RELATED APPLICATIONS

This application contains subject matter that is related to the subject matter of the following co-pending applications, each of which is assigned to the same assignee as this application, International Business Machines Corporation of Armonk, N.Y. Each of the below listed applications is hereby incorporated herein by reference in its entirety: Early Directory Access of a Double Rate Elastic Interface, U.S. Ser. No. 11/426,675; Late Data Launch for a Double Data Rate Elastic Interface, U.S. Ser. No. 11/426,671; Mechanism for Windaging of a Double Rate Driver, U.S. Ser. No. 11/426,648, Double Rate Chaining for Synchronous DDR Interfaces, U.S. Ser. No 11/426,651.

FIELD OF THE INVENTION

This invention relates to synchronous interfaces in computer and other digital electronic systems that use multiple integrated circuits, and particularly relates to programmable cycle delays at the driver circuits to alleviate the synchronization requirement of signals from different driver circuits at one or more receiver circuits.

BACKGROUND OF THE INVENTION

In digital data systems in general, and in computer systems in particular, there is an ever-increasing drive for larger bandwidth and higher performance. These systems are comprised of discreet integrated circuit chips that are interconnected. Data moves through a chip and between chips in response to clock pulses, which are intended to maintain synchronization of the data in parallel paths. At the extremely high data rates in today's systems, variations in the propagation of data over a bus along one path as compared to another path on the bus (i.e. skew) can exceed one clock cycle. U.S. Pat. No. 6,334,163, which is assigned to the assignee of this application and is incorporated herein by reference, discloses a so called Elastic Interface (EI) that can compensate for bus skew greater than one clock cycle without a performance penalty. However, packaging technology has not been able scale up to match the performance and bandwidth of the chip and interface technologies. In order to reduce the number I/O terminals on a chip and the number of conductive paths in a bus between chips, the prior art transfers data at a so called Double Data Rate (DDR), in which data is launched onto the bus at both the rising and falling edges of the clock. This allows the same amount of data to be transferred (i.e. bandwidth) with only half the number of bus conductors and half the number of I/O ports, as compared with a system where data is transferred only on a rising or a falling edge. The higher frequency employed in a Double Data Rate bus requires a finer granularity in capturing data at the receiver end of the bus. This requires an increase in the number of latches in an elastic interface in order to maintain the same elasticity interval as compared with a bus operating at a lower frequency. For example, if there were four clock cycles of elasticity at a data transfer rate of x, going to a double data rate mode of data transfer doubles the number of receiver latches that may be required to maintain the same elasticity. This decreases the time duration of valid data being kept by the receiving logic, thus forcing the receiver to have more logic and storage circuits to yield the same valid data time. The receiver logic and storage circuits are especially important and become complicated when the packaging cannot force wire to de-skew arriving data among chip interfaces and all data is required to arrive at the receiving end on the same logical cycle.

It is also common and necessary to partition and transfer instructions and data signals across multiple integrated circuit chips. One of the requirements is that the signals at the receiving ends of one or multiple chips must be synchronized in the same cycle. Even though the driver chips send signals in the same cycle, the signals arrive at the receiver chip(s) not necessarily in the same cycle due to delay differences of the transmission lines of high-speed interfaces. To meet this receiver synchronization requirement, the receiver chip utilizes complicated logic and/or circuit techniques to resynchronize the signals back to the same cycle to compensate the delay differences. Due to the high computer clock frequency and data transfer rate, the signal delay differences from different driver chips are multiple cycles at the receiver chip(s). The multi-cycle delay differences can often be beyond the limit that the receiver chip(s) being able to compensate.

SUMMARY OF THE INVENTION

One object of the invention is the provision of a double data rate elastic interface that simplifies the implementation of the interface.

An object of this invention is the provision of a double data rate elastic interface in which the number of latch stages required for the elastic receiver is reduced.

Briefly, this invention contemplates the provision of a double data rate elastic interface in which programmable latch stages provide an elastic delay, preferably on the driving side of the elastic interface. However, the invention is not limited to the driver side/chip, it can be implemented in the receiver side/chip as well. However, since the receiver side of an elastic interface already has complicated logic, the invention will be usually implemented on the driving side. The programmable latch stages on the driving chip side of the interface, can often operate at the local clock frequency (the same frequency as the elastic interface bus clock frequency), which in turn is half of the double data rate at which the receiving latch stages operate, thereby decreasing the logic and storage resources in the interface receivers. The programmable latch stages can also be used in the case that the local clock frequency is twice the elastic interface bus clock frequency, but without the slower on-chip data cycle time advantage. Thus, the receiver buffering storage/FIFO logic is only needed for the delay uncertainly due to process, voltage, temperature etc. (elasticity requirements) within a logical bus while the driver chip bus interface logic compensates for the delay differences among chips using the programmable latch stages. This invention also allows the flexibility to align signals to the required cycle boundaries but not necessarily the same cycle.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
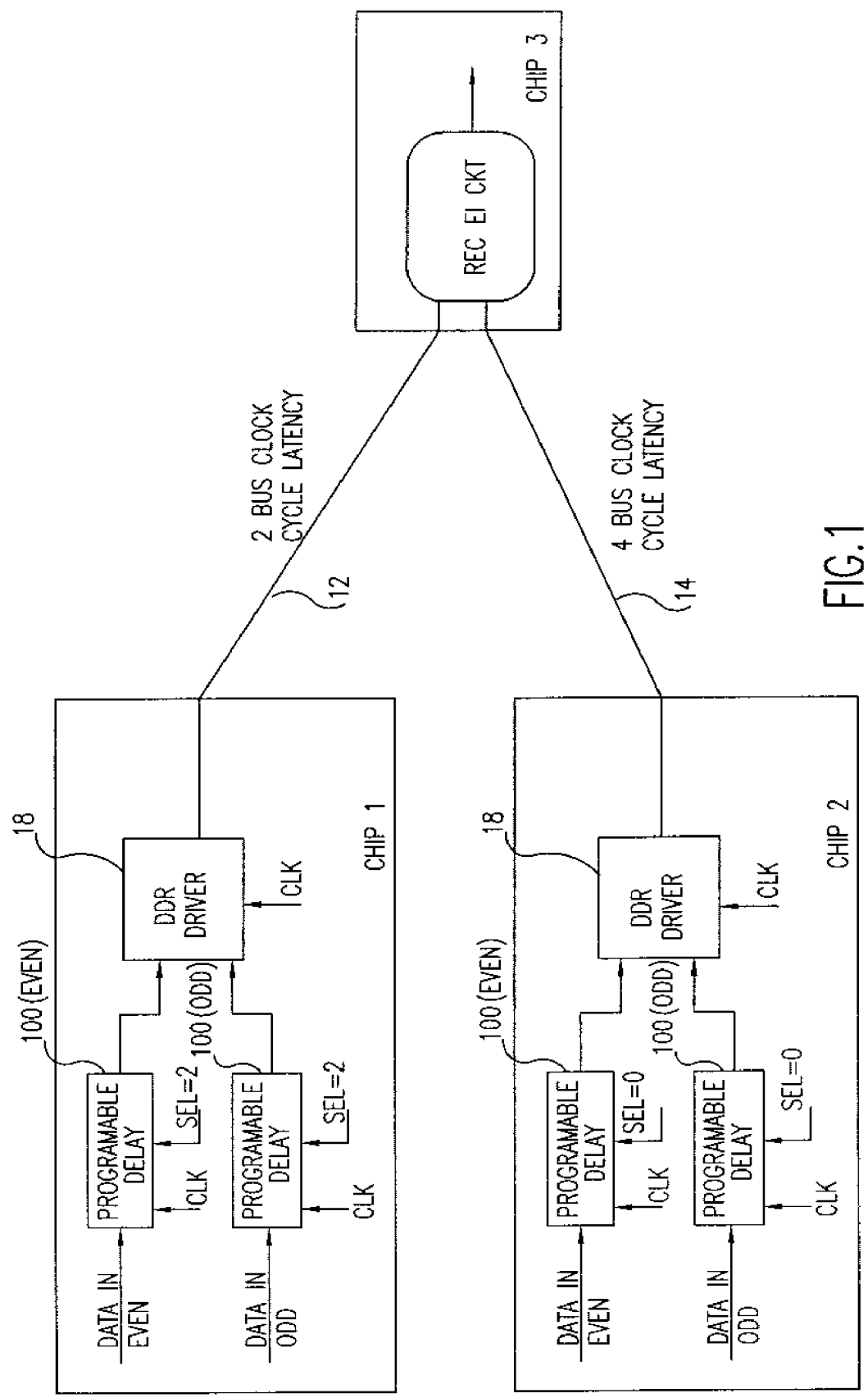
FIG. 1 is a block diagram showing chips each respectively coupled to the same receiver chip each by a double data rate bus.

Referring now to FIG. 1 of the drawings, by way of illustration, it shows two chips, chip 1 and chip 2 coupled by their respective double data rate buses 12 and 14 to a third chip (chip 3) via its elastic interface circuit EI CKT. In this specific embodiment of the invention shown in FIG. 1, the stages on the driving chip side of the interface operate at a local clock frequency CLK (the same frequency as the elastic interface bus clock frequency), which in turn is half of the double data rate since double data rate (DDR) bus drivers of chips 1 and 2 each use both edges of the local clock CLK to drive the data into the bus. One part of the synchronous data required by chip 3 comes from chip 1 and another part comes from chip 2. These two parts need to be aligned in time, one to the other in chip 3. For purposes of illustration only, it is assumed that chip 1 has a two bus clock cycle latency in transmitting data over its bus 12 to the chip 3 and chip 2 has a four bus clock cycle latency in transmitting data to the chip 3 over its bus 14. As will be appreciated by those skilled in the art, with the assumed two-cycle latency difference between chips 1 and 2, four First In First Out (FIFO) receiver latches would typically be required in the elastic interface (EI CKT) of chip 3 for each I/O bus port in order to align the data from chips 1 and 2 with the buses operating at a double data rate. As explained in more detail in the above referenced applications, one half of the synchronous data (EVEN DATA) comes from one on chip source and the other half (ODD DATA) comes from another source. Each half is coupled to the input of a separate programmable delay element, 100 on one edge of the local clock CLK. The outputs of the programmable delay elements are coupled to the inputs of a DDR Driver 18 after no delay or a delay equal to the number of local clock cycles inserted by the programmable delay element. The DDR Driver couples first one half of the register (EVEN DATA) to the bus than the other half of the data (ODD DATA) on each edge of the local clock. As will be appreciated by those skilled in the art, the DDR Driver 18 can have many different implementations, typically implemented with latches and a 2-to-1 MUX.

Figure 2:
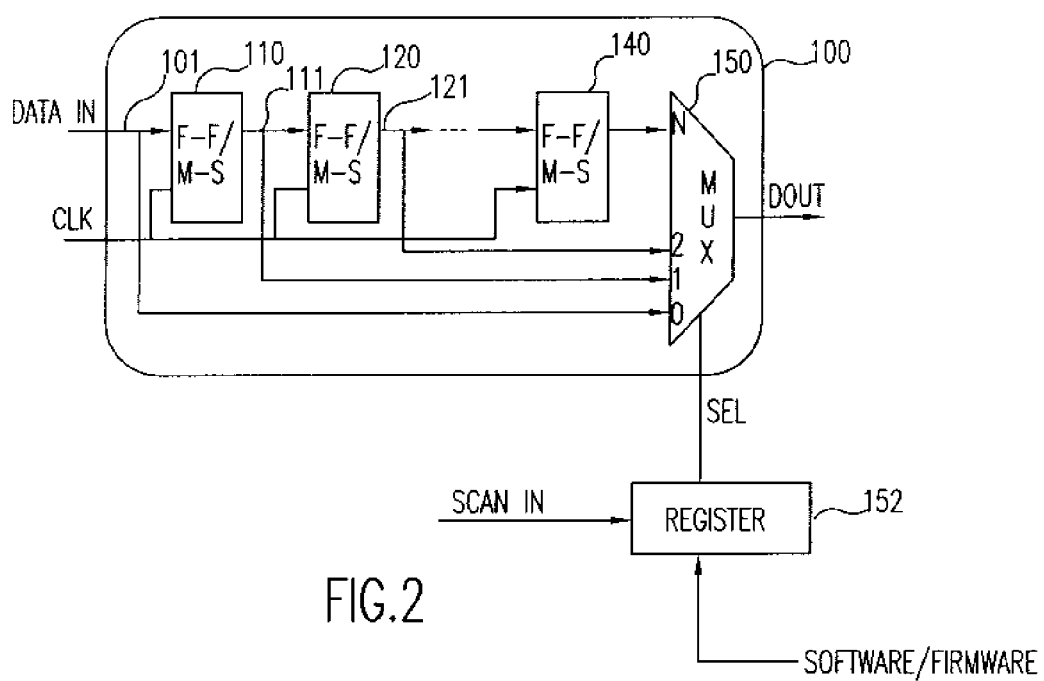
FIG. 2 is block diagram of one embodiment of a double data rate elastic interface bus driver in accordance with the teachings of this invention.
Figure 3:
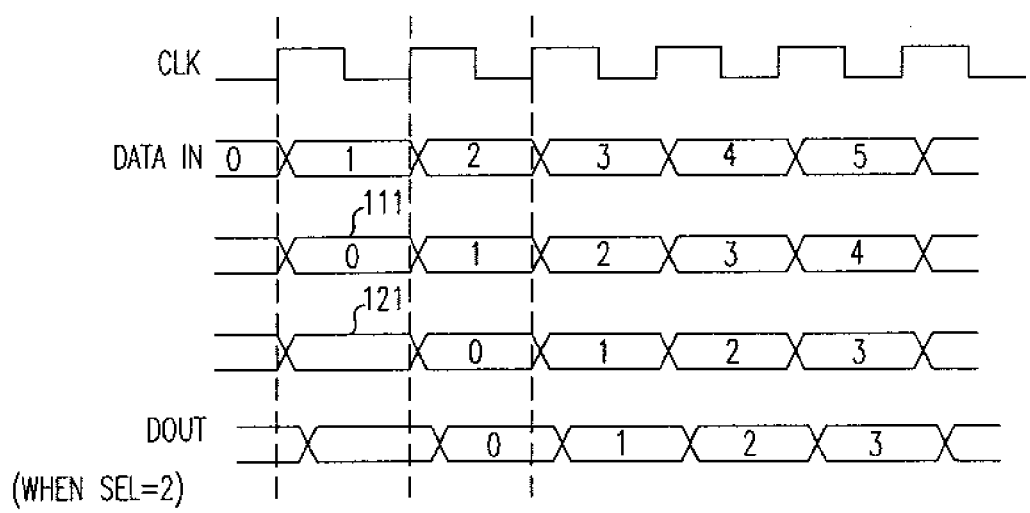
FIG. 3 is a timing diagram related to FIG. 2.

Referring now to FIG. 2 in addition to FIG. 1, in accordance with the teachings of this invention, the program selectable set of latches 100, preferably on the driver side of the interface (i.e. chips 1 and 2), driven by clock CLK at the chip's local clock rate, compensates for skew between chips, so that the receiver elastic interface FIFO logic needs only to compensate for the elasticity requirements within a logical bus. In a double data rate elastic interface, each program selectable latch on the driver side operating at the local clock rate can compensate for two double data rate bit times, thus eliminating the need for two latches in the receiver elastic interface logic. The program selectable set of latches 100 is comprised of a chain of series coupled flip-flops F-F or master-slave latches M-S 110, 120, ... 140. The number of stages determines the maximum amount of skew that can be compensated for. Data (DATA IN) is stored in the first stage 101 on one edge of the local clock CLK. As shown in FIG. 3, it is stored in this example on a rising edge. On the next rising edge, the data in stage 101 is transferred to the next stage 120 via signal bus 11. Concurrently, the data in stage 120 is transferred to the next stage via signal bus 121, and so forth. Subsequent DATA IN bits are stored in the first stage, and so on, as illustrated. The output of each stage is also coupled as an input to a multiplexer MUX 150 whose output DOUT is coupled to the driver 18. The select input to the MUX 150 which may be controlled by scan in data or by software/firmware programmable data stored in register 152, or by both alternatively, determines which stage is coupled to the output DOUT and hence the number of cycles the input is delayed. In this example, the select input (SEL) to each chip 1 MUX 150 selects the output of the second stage 120 and the select input (SEL) to each chip 2 MUX 150 selects DIN or zero delay, thus compensating for the skew introduced by the difference between the four bus-clock cycle latency of bus 14 and the two cycle latency of bus 12. The size of the mux and the number of stages of the mux as well as the value of the select bus provides for a programmable number of cycles of data delay from data_in to data_out.

Referring now to FIG. 3 is shown a timing diagram depicting the programmable data delay of the invention. The input data (DATA_IN) is aligned to the clock (CLK). Notice that the waveform of the bus 111 shows that the data lags the input data by one clock cycle. Likewise, the waveform of the bus 121 shows that the data lags the input data by two clock cycles, and so on. The select input (SEL in FIG. 2) is used to select one of the staged buses (111, 121, etc.), thus providing the waveform for the data_out (DOUT). In this example, the depicted waveform for data_out (DOUT) corresponds to a mux with select value (SEL=2).

Figure 4:
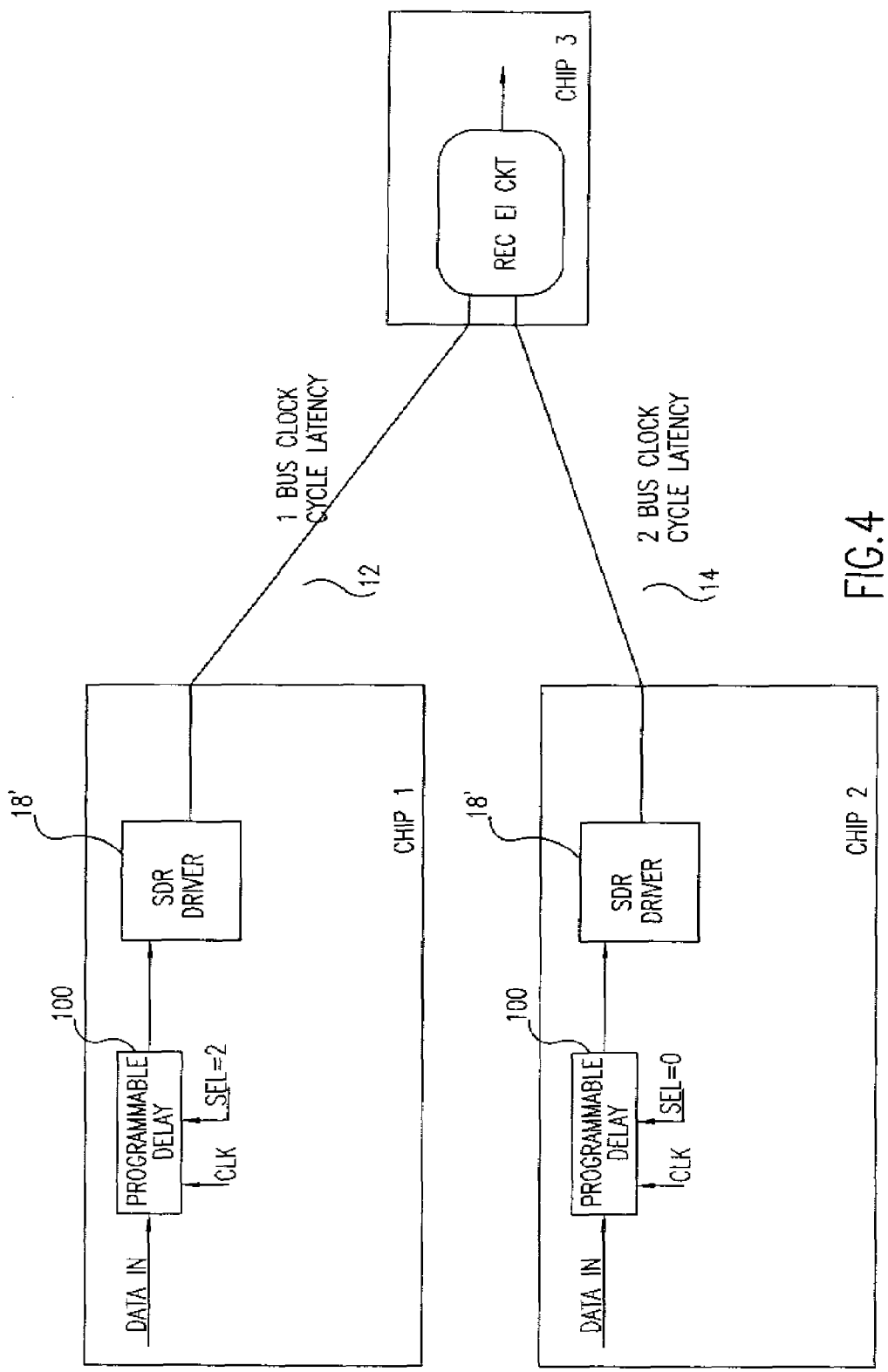
FIG. 4 is a block diagram similar to FIG. 1 showing an embodiment in which the local clock frequency is twice the elastic interface bus clock frequency.

Referring now to FIG. 4, it illustrates an embodiment of the invention in which the on chip clock frequency is twice the elastic interface bus clock frequency. Here the double data rate driver DDR 18 has been replaced by a driver DVR 18' in which data is launched onto the bus on one edge of the local clock signal. Here it will be appreciated that a program delay setting compensates for only a half of the bus clock cycle period. Thus, setting the programmable delay to 2 compensates for only one bus clock cycle latency.

The capabilities of the present invention can be implemented in software, firmware, hardware or some combination thereof. As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for synchronizing data transmitted to a receiver on a third chip from a first circuit on a first chip over a first bus at each edge of a local clock with data transmitted to said receiver from a second circuit on a second chip over a second bus at each edge of said local clock, including the steps of:
    providing programmable data storage on said first chip with each stage of said data storage storing data for one cycle of said local clock; and
    programming said programmable data storage to store data on said first chip for an interval to compensate for bus latency on said first bus that is less than bus latency on said second bus.

2. A method for synchronizing data as in claim 1 wherein said programmable data storage is comprised of series connected stages of first-in, first-out latches.

3. A method for synchronizing data as in claim 2 wherein said interval is equal to the difference in bus latency between said first bus and said second bus.

4. A method for synchronizing data as in claim 2 wherein said programming step includes providing a select input to a multiplexer that connects one of said series connected stages to said first bus.

5. A method for synchronizing data as in claim 1 wherein said interval is equal to the difference in bus latency between said first bus and said second bus.

6. A method for synchronizing data as in claim 1 wherein said programming step includes providing a select input to a multiplexer that connects one of said series connected stages to said first bus.

7. A method for synchronizing data as in claim 6 wherein said select input is determined by scan in data.

8. A method for synchronizing data as in claim 6 wherein said select input is controlled by a software/firmware addressable register.

9. A method for synchronizing data as in claim 1 further including the steps of:
    providing receiver elasticity alignment at a receiver circuit; and
    allowing said programmable data storage to be used to reduce receiver elasticity requirement.

* * * * *